US008673711B2

(12) United States Patent
Kim et al.

(10) Patent No.: US 8,673,711 B2

(45) Date of Patent: Mar. 18, 2014

(54) METHODS OF FABRICATING A SEMICONDUCTOR DEVICE HAVING A HIGH-K GATE DIELECTRIC LAYER AND SEMICONDUCTOR DEVICES FABRICATED THEREBY

(75) Inventors: WeonHong Kim, Suwon-si (KR); Dae-Kwon Joo, Osan-si (KR); Hajin Lim, Seoul (KR); Jinho Do, Yongin-si (KR); Kyungil Hong, Suwon-si (KR); Moonkyun Song, Anyang-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 225 days.

(21) Appl. No.: 13/240,217

(22) Filed: Sep. 22, 2011

(65) Prior Publication Data

US 2012/0129310 A1 May 24, 2012

(30) Foreign Application Priority Data

Nov. 22, 2010 (KR) ........................ 10-2010-0116337

(51) Int. Cl.
*H01L 21/8238* (2006.01)
*H01L 21/4763* (2006.01)

(52) U.S. Cl.
USPC ........... 438/199; 438/216; 438/275; 438/591; 438/765; 438/769; 257/E21.625

(58) Field of Classification Search
USPC ........... 438/199, 216, 275, 591; 257/E21.625
See application file for complete search history.

(56) References Cited

U.S. PATENT DOCUMENTS

| | | | | |
|---|---|---|---|---|
| 7,268,047 | B2 | 9/2007 | Arikado et al. | |
| 2004/0232499 | A1 * | 11/2004 | Ryoo | 257/410 |
| 2006/0228898 | A1 | 10/2006 | Wagda et al. | |
| 2010/0327373 | A1 * | 12/2010 | Carter et al. | 257/392 |

FOREIGN PATENT DOCUMENTS

| | | | |
|---|---|---|---|
| JP | 2005-079309 | A | 3/2005 |
| JP | 2008-537848 | A | 9/2008 |
| KR | 10-2004-0045575 | A | 6/2004 |
| KR | 10-2005-0021336 | A | 3/2005 |
| KR | 10-2008-0002908 | A | 1/2008 |
| WO | WO-2006-107417 | | 10/2006 |

* cited by examiner

*Primary Examiner* — Telly Green

(74) *Attorney, Agent, or Firm* — Lee & Morse, P.C.

(57) ABSTRACT

A method of fabricating a semiconductor device includes forming a lower interfacial layer on a semiconductor layer, the lower interfacial layer being a nitride layer, forming an intermediate interfacial layer on the lower interfacial layer, the intermediate interfacial layer being an oxide layer, and forming a high-k dielectric layer on the intermediate interfacial layer. The high-k dielectric layer has a dielectric constant that is higher than dielectric constants of the lower interfacial layer and the intermediate interfacial layer.

18 Claims, 3 Drawing Sheets

Figure 1:
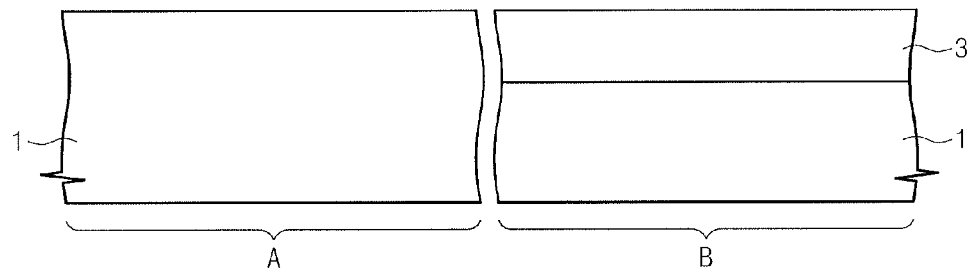

METHODS OF FABRICATING A SEMICONDUCTOR DEVICE HAVING A HIGH-K GATE DIELECTRIC LAYER AND SEMICONDUCTOR DEVICES FABRICATED THEREBY

CROSS-REFERENCE TO RELATED APPLICATIONS

Korean Patent Application No. 10-2010-0016337, filed on Nov. 22, 2010, in the Korean Intellectual Property Office, and entitled: "Methods of Fabricating A Semiconductor Device Having a High-K Gate Dielectric Layer and Semiconductor Devices Fabricated Thereby," is incorporated by reference herein in its entirety.

BACKGROUND

1. Field

The present disclosure herein relates to methods of fabricating a semiconductor device and semiconductor devices fabricated thereby. More specifically, the present disclosure relates to methods of fabricating a semiconductor device having a high-k gate dielectric layer and semiconductor devices fabricated thereby.

2. Description of Related Art

Semiconductor devices may include active devices such as N-channel metal-oxide-semiconductor (MOS) transistors and P-channel MOS transistors as well as passive devices such as capacitors. As the semiconductor devices become more highly integrated, the channel length of the MOS transistors has been decreased.

SUMMARY

According to an embodiment, there is provided a method of fabricating a semiconductor device including forming a lower interfacial layer on a semiconductor layer, the lower interfacial layer being an oxidation blocking layer formed by nitrifying the semiconductor layer, forming an intermediate interfacial layer on the lower interfacial layer, the intermediate interfacial layer being formed of an oxide layer, and forming a high-k dielectric layer on the intermediate interfacial layer. The high-k dielectric layer has a dielectric constant that is higher than dielectric constants of the lower interfacial layer and the intermediate interfacial layer.

The semiconductor layer may contain germanium.

The oxidation blocking layer may be formed using a remote plasma nitrification process.

The remote plasma nitrification process may be performed using at least one of a nitrogen gas and an ammonia gas as a process gas at a temperature of about 400 degrees Celsius to about 750 degrees Celsius.

The intermediate interfacial layer may be formed using an oxygen gas and ultraviolet radiation at a temperature of about 400 degrees Celsius to about 750 degrees Celsius.

The method may further include forming an upper interfacial layer on the intermediate interfacial layer prior to formation of the high-k dielectric layer. The upper interfacial layer may be a nitride layer and may be thicker than the lower interfacial layer.

The method may further include forming a gate electrode layer on the high-k dielectric layer.

The gate electrode layer may include a metal layer.

According to an embodiment, there is provided a semiconductor device including an interfacial layer pattern on a predetermined region of a semiconductor layer, a high-k dielectric layer pattern on the interfacial layer pattern, and a gate electrode on the high-k dielectric layer pattern. The interfacial layer pattern includes a nitride layer pattern contacting the semiconductor layer and an oxide layer pattern on the nitride layer pattern, and the high-k dielectric layer pattern has a dielectric constant that is higher than dielectric constants of the nitride layer pattern and the oxide layer pattern.

The semiconductor layer may contain germanium.

According to an embodiment, there is provided a method of fabricating a semiconductor device including providing a semiconductor substrate, nitrifying an exposed surface of the semiconductor substrate to form a first nitride interfacial layer, forming an oxide interfacial layer on the first nitride interfacial layer, and forming a high-k dielectric layer on the first nitride interfacial layer, wherein the high-k dielectric layer has a dielectric constant that is higher than dielectric constants of the first nitride interfacial layer and the oxide interfacial layer.

The substrate may include a first region and a second region, the second region being formed of a material having a different work function from that of the first region. The nitride interfacial layer, the oxide interfacial layer and the high-k interfacial layer may be formed in the first region and the second region The material of the second region of the semiconductor substrate may contain germanium.

The method may further include patterning the first region and the second region to form first and second semiconductor device patterns in the first and second regions respectively, each semiconductor device pattern including a first nitride interfacial layer pattern, an oxide interfacial layer pattern, and a high-k dielectric layer pattern.

The patterning of the first and second regions may expose the semiconductor substrate to form exposed semiconductor substrate portions adjacent to the first and second semiconductor device patterns. The method may further include implanting impurity ions of a first type in the exposed semiconductor substrate portions in the first region adjacent to the first semiconductor device pattern and implanting impurity ions of a second type in the exposed semiconductor substrate portions in the second region adjacent to the second semiconductor device pattern The method may further include forming metal gate electrodes on the high-k dielectric patterns of the first and second semiconductor device patterns.

The first nitride interfacial layer may be formed using a remote plasma nitrification process.

The remote plasma nitrification process may be performed using at least one of a nitrogen gas and an ammonia gas as a process gas at a temperature of about 400 degrees Celsius to about 750 degrees Celsius.

The oxide interfacial layer may be formed using an oxygen gas and ultraviolet radiation at a temperature of about 400 degrees Celsius to about 750 degrees Celsius.

The method may further include forming a second nitride interfacial layer on the oxide interfacial layer prior to the forming of the high-k dielectric layer. The second nitride interfacial layer may be thicker than the first nitride interfacial layer.

BRIEF DESCRIPTION

The above and other features and advantages will become more apparent to those of ordinary skill in the art by describing in detail exemplary embodiments with reference to the attached drawings, in which:

FIGS. 1 to 5 illustrate cross-sectional views depicting methods of fabricating a semiconductor device according to embodiments and semiconductor devices fabricated thereby.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

As used herein, the term "and/or" includes any and all combinations of one or more of the associated listed items. It will be understood that when an element is referred to as being "connected" or "coupled" to another element, it may be directly connected or coupled to the other element or intervening elements may be present. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal exemplary views. Accordingly, shapes of the exemplary views may be modified according to manufacturing techniques and/or allowable errors. Therefore, the embodiments are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope thereof.

FIGS. 1 to 5 are cross sectional views to illustrate methods of fabricating a semiconductor device according to embodiments.

Referring to FIG. 1, a semiconductor substrate 1 having a first region A and a second region B may be provided. The semiconductor substrate 1 may be a silicon substrate. The first region A and the second region B may correspond to an N-channel MOS transistor region and a P-channel MOS transistor region, respectively. A semiconductor layer 3 may be formed on semiconductor substrate 1 in the second region B. The semiconductor layer 3 may be a material layer that is appropriate to adjust a threshold voltage of the P-channel MOS transistors. The semiconductor layer 3 may have a different work function from the semiconductor substrate 1. For example, the semiconductor layer 3 may include a germanium layer. In an example embodiment, the semiconductor layer 3 may be a silicon-germanium layer.

Figure 2:
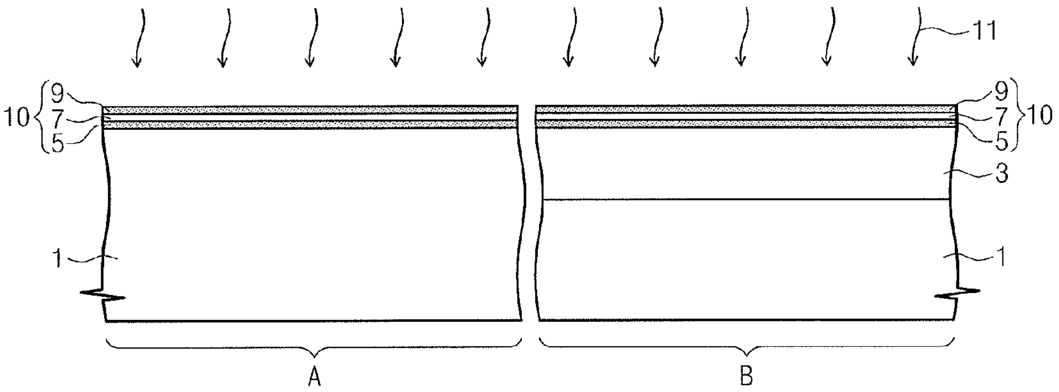

Referring to FIG. 2, an interfacial layer 10 may be formed on an entire surface of the substrate including the semiconductor layer 3. The interfacial layer 10 may be formed by sequentially stacking a lower interfacial layer 5, an intermediate interfacial layer 7 and an upper interfacial layer 9.

The lower interfacial layer 5 may be formed of an insulation layer that acts as an oxidation blocking layer or a oxidation resistant layer. For example, the lower interfacial layer 5 may be formed by nitrifying the semiconductor substrate 1 and the semiconductor layer 3. The lower interfacial layer 5 may be formed of a nitride layer using a plasma process. In an example embodiment, the lower interfacial layer 5 may be formed using a remote plasma nitrification process. The remote plasma nitrification process may be performed using at least one of a nitrogen gas and an ammonia gas as a process gas. Further, the remote plasma nitrification process may be performed at a low temperature of about 400 degrees Celsius to about 750 degrees Celsius. As result, the lower interfacial layer 5 maybe a uniform nitride layer directly formed on the semiconductor substrate 1 in the first region A and on the semiconductor layer 3 in the second region B. The lower interfacial layer 5 may be formed to directly contact the semiconductor substrate 1 in the first region A and the semiconductor layer 3 in the second region B. The lower interfacial layer 5, e.g., the nitride layer may be formed to a thickness that is less than about 5 angstroms.

The intermediate interfacial layer 7 may be formed using a thermal oxidation process or a chemical vapor deposition (CVD) process. If the intermediate interfacial layer 7 is formed using the CVD process, the CVD process may employ ultraviolet radiation in addition to a process gas such as an oxygen gas. The oxygen gas used as the process gas may be easily decomposed by the ultraviolet radiation even at a low temperature of about 500 degrees Celsius or the lower, thereby forming an oxide layer having a uniform thickness. In an example embodiment, the intermediate interfacial layer 7 may be foamed using a CVD process with ultraviolet radiation at a low temperature of about 400 degrees Celsius to about 750 degrees Celsius. As a result, a uniform oxide layer may be formed as the intermediate interfacial layer 7 on the lower interfacial layer 5. Additional thermal oxidation of the semiconductor substrate 1 and the semiconductor layer 3 may be suppressed during formation of the intermediate interfacial layer 7.

The upper interfacial layer 9 may be formed of the same material layer as the lower interfacial layer 5. The upper interfacial layer 9 may be formed of a nitride layer. The upper interfacial layer 9 may be formed to be thicker than the lower interfacial layer 5. In another example embodiment, formation of the upper interfacial layer 9 may be omitted.

Although not shown in the figures, the semiconductor substrate 1 may further include a third region. The third region may correspond to a high voltage MOS transistor region. A thick gate oxide layer may be formed in the high voltage MOS transistor region. The gate oxide layer of the high voltage MOS transistor may include a CVD oxide layer deposited by the CVD process. The CVD oxide layer may be densified at a high temperature to improve a gate leakage current characteristic. An annealing process 11 may be performed to densify the CVD oxide layer after formation of the interfacial layer 10. The annealing process 11 may be performed at a temperature within the range of about 700 degrees Celsius to about 900 degrees Celsius.

The semiconductor layer 3 may be a germanium containing layer, such as, for example, a silicon germanium layer, as described with reference to FIG. 1. The bonding energy of a germanium atom and an oxygen atom is greater than the bonding energy of a silicon atom and an oxygen atom. Thus, when the semiconductor substrate 1 and the semiconductor layer 3 are a silicon substrate and a silicon germanium layer, respectively, the semiconductor layer 3 may be oxidized more readily than the semiconductor substrate 1 during the annealing process 11. As a result, if a lower interfacial layer 5 according to embodiments is not present, an equivalent oxide thickness of a gate insulation layer formed in the P-channel MOS transistor region B may be greater than that of a gate insulation layer formed in the N-channel MOS transistor region A. In particular, when the equivalent oxide thickness is measured under a condition that a channel inversion layer is formed, a difference between the equivalent oxide thickness of the gate insulation layer of the N-channel MOS transistor and the equivalent oxide thickness of the gate insulation layer of the P-channel MOS transistor may increase more. As a result, in such a case, it may be difficult to optimize electrical characteristics of a complementary metal-oxide-semiconductor integrated circuit (CMOS IC) including the N-channel MOS transistors and the P-channel MOS transistors.

However, according to the embodiments, the lower interfacial layer 5 directly contacting the semiconductor substrate 1 and the semiconductor layer 3 may be formed of a nitride layer. The nitride layer may act as an oxidation resistant layer or an oxidation blocking layer. Thus, even though an annealing process 11 is performed, oxidation of the top surfaces of the semiconductor substrate 1 and the semiconductor layer 3 may be minimized or prevented. As a result, the equivalent oxide thickness of the gate insulation layer formed in the first region A may be kept substantially the same as the equivalent oxide thickness of the gate insulation layer formed in the second region B.

Figure 3:
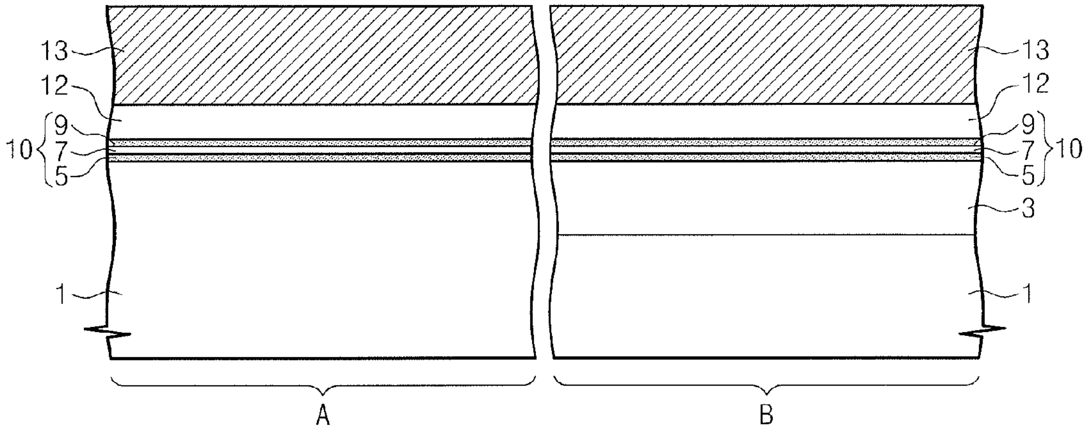

Referring to FIG. 3, a high-k dielectric layer 12 may be formed on the interfacial layer 10. The high-k dielectric layer 12 may be a material layer having a dielectric constant higher than the interfacial layers 5, 7 and 9. For example, the high-k dielectric layer 12 may include at least one of an aluminum oxide layer, a zirconium oxide layer, a hafnium oxide layer, a lanthanum oxide layer, a titanium oxide layer, a barium strontium titanate (BST) layer and a lead zirconate titanate (PZT) layer.

A dummy material layer 13 may be formed on the high-k dielectric layer 12. The dummy material layer 13 may be formed of a material layer having an etch selectivity with respect to a silicon oxide layer, which is widely used as an interlayer insulating layer. For example, the dummy material layer 13 may be formed of a polysilicon layer.

Figure 4:
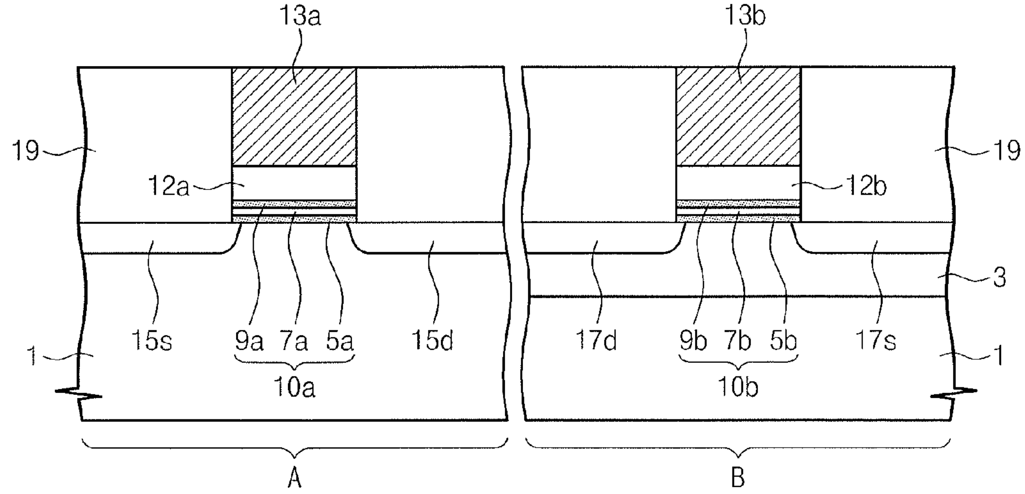

Referring to FIG. 4, the dummy material layer 13, the high-k dielectric layer 12 and the interfacial layer 10 may be patterned to form a first interfacial layer pattern 10*a*, a first high-k dielectric layer pattern 12*a* and a first dummy gate electrode 13*a* which are sequentially stacked in the first region A as well as a second interfacial layer pattern 10*b*, a second high-k dielectric layer pattern 12*b* and a second dummy gate electrode 13*b* which are sequentially stacked in the second region B. In an example embodiment, the upper interfacial layer 9 may be formed on the intermediate interfacial layer 7. In this case, the first interfacial layer pattern 10*a* may comprise a first lower interfacial layer pattern 5*a*, a first intermediate interfacial layer pattern 7*a* and a first upper interfacial layer pattern 9*a* which are sequentially stacked, and the second interfacial layer pattern 10*b* may comprise a second lower interfacial layer pattern 5*b*, a second intermediate interfacial layer pattern 7*b* and a second upper interfacial layer pattern 9*b* which are sequentially stacked.

Impurity ions of a first conductivity type may be implanted into the semiconductor substrate 1 in the first region A using the first dummy gate electrode 13*a* as an ion implantation mask, thereby forming a first source region 15*s* and a first drain region 15*d*. Similarly, impurity ions of a second conductivity type may be implanted into the semiconductor layer 3 in the second region B using the second dummy gate electrode 13*b* as an ion implantation mask, thereby forming a second source region 17*s* and a second drain region 17*d*. In an example embodiment, the first conductivity type and the second conductivity type may correspond to an N-type and a P-type, respectively.

An insulation layer 19 may be formed on the substrate having the first source/drain regions 15*s* and 15*d* and the second source/drain regions 17*s* and 17*d*. The insulation layer 19 may be formed of an oxide layer such as a silicon oxide layer. The insulation layer 19 may be planarized to expose the first and second dummy gate electrodes 13*a* and 13*b*.

Figure 5:
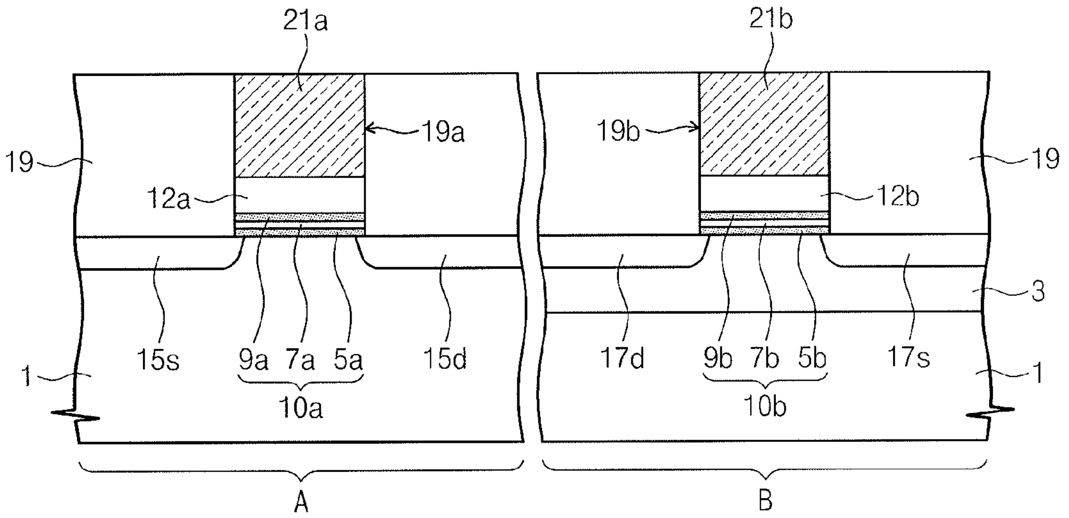

Referring to FIG. 5, the exposed first and second dummy gate electrodes 13*a* and 13*b* may be removed to form a first groove 19*a* exposing the first high-k dielectric layer pattern 12*a* and a second groove 19*b* exposing the second high-k dielectric layer pattern 12*b*. A first metal gate electrode 21*a* and a second metal gate electrode 21*b* may be formed in the first and second grooves 19*a* and 19*b*, respectively. The first metal gate electrode 21*a* may be formed of a different metal layer from the second metal gate electrode 21*b*. For example, a work function of the first metal gate electrode 21*a* may be different from that of the second metal gate electrode 21*b*.

The semiconductor device according to embodiments may comprise an interfacial layer pattern 10*a* or 10*b*, a high-k dielectric layer pattern 12*a* or 12*b* and a metal gate electrode 21*a* or 21*b* which are sequentially stacked on a semiconductor substrate 1 or a semiconductor layer 3, as illustrated in FIG. 5. The interfacial layer pattern 10*a* or 10*b* may include at least a lower interfacial layer pattern 5*a* or 5*b* and an intermediate interfacial layer pattern 7*a* or 7*b* which are sequentially stacked. That is, the lower interfacial layer pattern 5*a* or 5*b* may be disposed to directly contact the semiconductor substrate 1 or the semiconductor layer 3. In some example embodiments, the lower interfacial layer patterns 5*a* and 5*b* may be a nitride layer, and the intermediate interfacial layer patterns 7*a* and 7*b* may be an oxide layer.

By way of summation and review, as the semiconductor devices become more highly integrated, the channel length of the MOS transistors has been decreased. As a result, the MOS transistors of the highly integrated semiconductor device may suffer from a short channel effect.

It is desirable for MOS transistors to be appropriately designed to suppress the short channel effect. For example, it is desirable to reduce a vertical thickness of gate dielectric layers and a vertical thickness of source/drain regions of the MOS transistors A silicon oxide layer may be used as the gate dielectric layer. However, when the gate dielectric layer of the highly integrated semiconductor device is formed of a silicon oxide layer, the silicon oxide layer used as the gate dielectric layer may be formed to a thickness of about several nanometers. In this case, a gate leakage current flowing through the gate dielectric layer, i.e., the gate oxide layer may increase.

A high-k dielectric layer may be employed as a gate dielectric layer of the highly integrated semiconductor device. However, if the high-k dielectric layer is formed directly on a semiconductor substrate, an interfacial characteristic between the semiconductor substrate and the high-k dielectric layer may be significantly degraded. For example, the number of dangling bonds and charge traps formed at the interface between the semiconductor substrate and the high-k dielectric layer may increase to degrade reliability of the MOS transistors. The stress of the high-k dielectric layer may be directly applied to the semiconductor substrate. In addition, the high-k dielectric layer may not be able to function as a barrier layer to block the diffusion of dopants and/or impurities. Thus, it may be desirable to form an interfacial layer acting as a stress buffer layer and a diffusion barrier layer between the semiconductor substrate and the high-k dielectric layer.

If a surface of the semiconductor substrate is additionally oxidized by a subsequent annealing process after formation of an interfacial layer and a high-k dielectric layer, an equivalent oxide thickness of a gate insulation layer including the interfacial layer and the high-k dielectric layer may be increased. In this case, the characteristics of the MOS transistors may be degraded.

In this regard, the embodiments disclosed herein advance the art by providing an interfacial layer such as a nitride layer that is directly formed on a semiconductor substrate and a semiconductor layer prior to formation of a high-k dielectric layer. Thus, even though an annealing process is performed after formation of the interfacial layer, oxidation of the semiconductor substrate and the semiconductor layer may be minimized. The interfacial layer may act as an oxidation resistant layer or an oxidation blocking layer. As a result, interface characteristics between the semiconductor substrate (or the semiconductor layer) and the high-k dielectric layer may be improved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of fabricating a semiconductor device comprising:

forming a lower interfacial layer on a semiconductor layer, the lower interfacial layer being an oxidation blocking layer formed by nitrifying the semiconductor layer;

forming an intermediate interfacial layer on the lower interfacial layer, the intermediate interfacial layer being formed of an oxide layer;

forming an upper interfacial layer on the intermediate interfacial layer, wherein the upper interfacial layer is a nitride layer and is thicker than the lower interfacial layer; and forming a high-k dielectric layer on the intermediate interfacial layer, the high-k dielectric layer being formed after forming the upper interfacial layer, wherein the high-k dielectric layer has a dielectric constant that is higher than dielectric constants of the lower interfacial layer and the intermediate interfacial layer.

2. The method as claimed in claim 1, wherein the semiconductor layer contains germanium.

3. The method as claimed in claim 1, wherein the oxidation blocking layer is formed using a remote plasma nitrification process.

4. The method as claimed in claim 3, wherein the remote plasma nitrification process is performed using at least one of a nitrogen gas and an ammonia gas as a process gas at a temperature of about 400 degrees Celsius to about 750 degrees Celsius.

5. The method as claimed in claim 1, wherein the intermediate interfacial layer is formed using an oxygen gas and ultraviolet radiation at a temperature of about 400 degrees Celsius to about 750 degrees Celsius.

6. The method as claimed in claim 1, further comprising forming a gate electrode layer on the high-k dielectric layer.

7. The method as claimed in claim 6, wherein the gate electrode layer includes a metal layer.

8. A method of fabricating a semiconductor device comprising:

providing a semiconductor substrate;

nitrifying an exposed surface of the semiconductor substrate to form a first nitride interfacial layer;

forming an oxide interfacial layer on the first nitride interfacial layer;

forming a second nitride interfacial layer on the oxide interfacial layer, wherein the second nitride interfacial layer is thicker than the first nitride interfacial layer; and forming a high-k dielectric layer on the first nitride interfacial layer, the high-k dielectric layer being formed after forming the second nitride interfacial layer, wherein the high-k dielectric layer has a dielectric constant that is higher than dielectric constants of the first nitride interfacial layer and the oxide interfacial layer.

9. The method as claimed in claim 8, wherein:

the substrate includes a first region and a second region, the second region being formed of a material having a different work function from that of the first region, and the nitride interfacial layer, the oxide interfacial layer and the high-k dielectric layer are formed in the first region and the second region.

10. The method as claimed in claim 9, wherein the material of the second region of the semiconductor substrate contains germanium.

11. The method as claimed in claim 9, further comprising patterning the first region and the second region to form first and second semiconductor device patterns in the first and second regions respectively, each semiconductor device pattern including a first nitride interfacial layer pattern, an oxide interfacial layer pattern, and a high-k dielectric layer pattern.

12. The method as claimed in claim 11, wherein:

the patterning of the first and second regions exposes the semiconductor substrate to form exposed semiconductor substrate portions adjacent to the first and second semiconductor device patterns, and the method further includes implanting impurity ions of a first type in the exposed semiconductor substrate portions in the first region adjacent to the first semiconductor device pattern and implanting impurity ions of a second type in the exposed semiconductor substrate portions in the second region adjacent to the second semiconductor device pattern.

13. The method as claimed in claim 12, further including forming metal gate electrodes on the high-k dielectric patterns of the first and second semiconductor device patterns.

14. The method as claimed in claim 8, wherein the first nitride interfacial layer is formed using a remote plasma nitrification process.

15. The method as claimed in claim 14, wherein the remote plasma nitrification process is performed using at least one of a nitrogen gas and an ammonia gas as a process gas at a temperature of about 400 degrees Celsius to about 750 degrees Celsius.

16. The method as claimed in claim 8, wherein the oxide interfacial layer is formed using an oxygen gas and ultraviolet radiation at a temperature of about 400 degrees Celsius to about 750 degrees Celsius.

17. The method as claimed in claim 1, wherein the intermediate interfacial layer is formed after forming the lower interfacial layer on the semiconductor layer.

18. The method as claimed in claim 8, wherein the oxide interfacial layer is formed after forming the first nitride interfacial layer on the semiconductor substrate.

* * * * *

UNITED STATES PATENT AND TRADEMARK OFFICE

CERTIFICATE OF CORRECTION

PATENT NO. : 8,673,711 B2
APPLICATION NO. : 13/240217
DATED : March 18, 2014
INVENTOR(S) : Kim et al.

It is certified that error appears in the above-identified patent and that said Letters Patent is hereby corrected as shown below:

In the specification:

Column 1, lines 7-15

"CROSS-REFERENCE TO RELATED APPLICATIONS

Korean Patent Application No. 10-2010-0016337, filed on November 22, 2010, in the Korean Intellectual Property Office, and entitled: "Methods of Fabricating A Semiconductor Device Having a High-K Gate Dielectric Layer and Semiconductor Devices Fabricated Thereby," is incorporated by reference herein in its entirety."

should read:

-- CROSS-REFERENCE TO RELATED APPLICATIONS

Korean Patent Application No. 10-2010-0116337, filed on November 22, 2010, in the Korean Intellectual Property Office, and entitled: "Methods of Fabricating A Semiconductor Device Having a High-K Gate Dielectric Layer and Semiconductor Devices Fabricated Thereby," is incorporated by reference herein in its entirety. --

Signed and Sealed this
Tenth Day of June, 2014

Michelle K. Lee
*Deputy Director of the United States Patent and Trademark Office*